United States Patent
Fumo et al.

(10) Patent No.: US 8,196,544 B2
(45) Date of Patent: Jun. 12, 2012

(54) SYSTEM FOR DEPOSITING LIQUID MATERIAL ONTO A SUBSTRATE

(76) Inventors: Cesare Fumo, Gorizia (IT); Jozef Vodopivec, Gorizia (IT)

( * ) Notice: Subject to any disclaimer, the term of this patent is extended or adjusted under 35 U.S.C. 154(b) by 0 days.

(21) Appl. No.: 12/788,805

(22) Filed: May 27, 2010

(65) Prior Publication Data

US 2010/0247791 A1    Sep. 30, 2010

Related U.S. Application Data

(62) Division of application No. 10/500,298, filed as application No. PCT/IT02/00780 on Dec. 11, 2002, now Pat. No. 7,757,628.

(30) Foreign Application Priority Data

Dec. 27, 2001    (IT) .................................. UD01A0220

(51) Int. Cl.
*B05B 15/00* (2006.01)
*B41J 2/01* (2006.01)
*H05K 3/12* (2006.01)

(52) U.S. Cl. .......................... 118/302; 118/315; 222/109

(58) Field of Classification Search .................. 118/302, 118/313–315, 305, 70; 239/104, 106, 114, 239/115, 123; 347/22–36; 427/421.1–427.7; 222/109, 630
See application file for complete search history.

(56) References Cited

U.S. PATENT DOCUMENTS

| | | | |
|---|---|---|---|
| 3,661,304 A | | 5/1972 | Martinez et al. |
| 4,403,229 A | * | 9/1983 | Barteck ............................ 347/89 |
| 6,190,727 B1 | * | 2/2001 | Thaggard ............................ 427/9 |
| 6,224,180 B1 | * | 5/2001 | Pham-Van-Diep et al. ...... 347/2 |
| 6,428,862 B1 | | 8/2002 | Noguchi |
| 6,868,885 B2 | * | 3/2005 | Kakimoto et al. ............. 156/379 |
| 2004/0061747 A1 | * | 4/2004 | Nakao et al. .................... 347/85 |
| 2006/0017770 A1 | | 1/2006 | Harada et al. |

FOREIGN PATENT DOCUMENTS

| | | |
|---|---|---|
| DE | 19807202 A | 8/1999 |
| DE | 19817530 A | 10/1999 |
| DE | 19842379 A | 5/2000 |
| EP | 0930641 A | 7/1999 |
| JP | 02229489 A | 9/1990 |

(Continued)

OTHER PUBLICATIONS

Patent Abstracts of Japan, vol. 018, No. 157 (C-1180), Mar. 16, 1994 & JP 05 329423 A (Matsushita Electric Ind. Co Ltd), Dec. 14, 1993, abstract.

(Continued)

*Primary Examiner* — William Phillip Fletcher, III
(74) *Attorney, Agent, or Firm* — Sughrue Mion, PLLC

(57) ABSTRACT

A machine controlled by a computer for depositing a liquefied electronically-interactive material on a sheet or support card, which includes: a base (1) to support the mobile bed (2) which is moved longitudinally (Y) by means of a worm screw (20) whose movement is controlled by a computer, and for the support and fixing of the said support sheet or card "S" on which the layer of electronically-interactive material is to be formed; a bridge above the said base with a transversal shaft (30) which also has a worm screw and whose movement is also controlled by the said computer, in which the transversal shaft (30) moves the said distribution unit for the electronically-interactive material to be deposited (3) in an orthogonal direction (X).

3 Claims, 2 Drawing Sheets

FOREIGN PATENT DOCUMENTS

| | | |
|---|---|---|
| JP | 04067696 A | 3/1992 |
| JP | 04223390 A | 8/1992 |
| JP | 05329423 A | 12/1993 |
| JP | 2001044601 A | 2/2001 |
| JP | 2001246299 A | 9/2001 |

OTHER PUBLICATIONS

Patent Abstracts of Japan, vol. 2000, No. 19, Jun. 5, 2001 & JP 2001 044601 A (Brother Ind. Ltd), Feb. 16, 2001, abstract.

Patent Abstracts of Japan, vol. 014, No. 541 (E-1007), Nov. 29, 1990 & JP 02 229489 A (Juki Corp), Sep. 12, 1990, abstract.

Patent Abstracts of Japan, vol. 016, No. 574 (E-1298), Dec. 14, 1992 & JP 04 223390 A (Matsushita Electric Ind. Co Ltd), Aug. 13, 1992, abstract.

Patent Abstracts of Japan, vol. 016, No. 275 (E-1219), Jun. 19, 1992 & JP 04 067696 A (Juki Corp), Mar. 3, 1992, abstract.

Patent Abstracts of Japan, vol. 2000, No. 26, Jul. 1, 2002 & 2001 246299 A (Toshiba Corp), Sep. 11, 2001, abstract.

* cited by examiner

SYSTEM FOR DEPOSITING LIQUID MATERIAL ONTO A SUBSTRATE

This is a Divisional Application of application Ser. No. 10/500,298, filed Jan. 31, 2005, now U.S. Pat. No. 7,757,628, of Cesare FUMO, Jozef VODOPIVEC entitled A SYSTEM FOR DEPOSITING ELECTRONICALLY INTERACTIVE LIQUEFIED MATERIAL ONTO A SUPPORT SURFACE, which is a National Stage Application filed under §371 of PCT Application No. PCT/IT02/00780, filed Dec. 11, 2002, published as WO 2003/061357 A1, the entire disclosures of which are hereby incorporated by reference.

The object of this invention is a method for the formation of a layering of electronically-interactive material.

TECHNICAL FIELD

By the term electronically-interactive material, we mean any kind of material which is capable of electronically interacting both in an active sense, such as through conductivity, or in a negative sense, such as through insulation, and does not exclude other parameters such as the typical on/off function which characterizes micro-processors.

The invention is used preferably, but not exclusively, for the formation of a layering of electronically interactive material, such as in: the manufacture of electronic circuit boards; the creation of screens with a layer of electronically-interactive material to project images from a flat screen to create displays, which may also be flexible, directly incorporating a computerized system which does not exclude the function of a microprocessor with both organic and non-organic material, including the function of intelligence which may or may not be artificial, similar to cerebral functions; and also visualization or non-visualization with different grades of variable luminosity materials by means of electronically induced phenomena which cover the entire range of the spectrum.

BACKGROUND ART

According to the current state of the technology, the formation of a layering, either composed of a single layer or a number of layers, is carried out by either mechanical, chemical or photo-chemical methods. The techniques of layering with mechanical systems are slow and not very suitable for the miniaturization and precision which modern electronic techniques need to acquire.

For example, in order to create electronic circuit boards, which is one of the main, although not exclusive, uses of this invention, either photographic or photo-engraving techniques are used, which are far superior to mechanical systems.

In spite of this, modern technology requires techniques which are more rapid and efficient, and which also have miniaturization and precision capacities superior to those achieved up until now, if possible.

It is well known that, even with photo-engraving techniques, since a photo-sensitive layer has to be engraved, it is not possible to create designs and miniaturized circuits below a certain dimension. That is, it is not possible to go below certain values, which are determined by the minimum distance between two engravings, otherwise it would make the thin layer between them unstable because, if it is too thin, it could be easily detached or ruined. As a general rule, an acceptable value for the ratio of the distance between, one engraving and another and the thickness of the layer is>1. In fact, if the ratio were less than 1, the height of the section of the layer would be greater than the width, so the risk of breakage and a resulting short circuit between two adjacent circuits would be high.

DE-19817530A discloses a process and device for the production of a thin-multilayer structure.

U.S. Pat. No. 3,661,304 discloses a pressure impulse apparatus for initiating formation of fluid drops such as ink in high speed printing, wherein the drops are selectively placed on a paper web, providing a primary liquid supply at a constant pressure and starting means for applying a higher pressure impulse, the starting means including an auxiliary liquid supply.

Aim Of The Invention

The aim of this invention is to overcome the aforementioned drawbacks and to allow a layer of electronically-interactive material to be rapidly and quickly formed on a surface, having maximum precision even with the smallest of designs and an extremely low cost.

EXPLANATION OF THE INVENTION

The problem is overcome according to characteristics described below.

ADVANTAGES

The advantages obtained with the present invention solution are the following:
  Speed of the process.
  Maximum simplicity.
  Maximum precision.
  Maximum miniaturization of the structures designed and integrated in the layer.
  Maximum reliability, safety, robustness and duration of the layering.
  Overall reduction of manufacturing costs.
  Respect for the environment with the elimination of all waste materials or pollutants.

BRIEF DESCRIPTION OF THE DRAWINGS

These and other advantages will be shown in the following description and attached drawings of a preferential application of the solution according to the present invention, the details of which are intended to be exemplary and not limiting.

DETAILED DESCRIPTION OF THE SOLUTION ILLUSTRATED IN THE DRAWINGS

With reference to FIG. I, the formation of the layer of electronically-interactive material is carried out according to an innovative technique compared with previous technology, as follows:

A support (a board of plastic material S, for example) is positioned on a mobile bed 2, where the movement of the mobile bed 2 is controlled and programmed by a microprocessor according to a given coordinate (Y).
  Above, there is a distribution unit for punctiform jets of the liquefied material to be deposited (3) in order to form the layer on the support (S). The distribution unit is s programmed to move transversally in a controlled manner by a microprocessor, similar to that of a traditional inkjet printer; with the distributor having a number of nozzles for the distribution of points the equivalent of pixels, which are able to cover a certain area equal to n×d, where "n" is the number of nozzles which are sprayed in line, and "d" is the distance along the line from one nozzle to another, with a layout, for example, along three lines alternately disposed, 1, 2, 3, for a length of 70 mm.

The forward progress of the underlying support is in steps of 70 mm, up to the complete deposit on the surface of the support in question (S).

Figure 1:
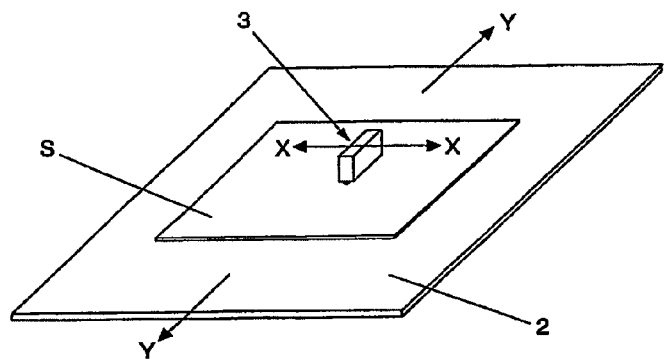
FIG. 1 is a schematic view of a mechanical solution of an application machine for the formation of a layering of electronically-interactive material on a support sub-layer, such as in the manufacturing of an electronic circuit board.
Figure 2:
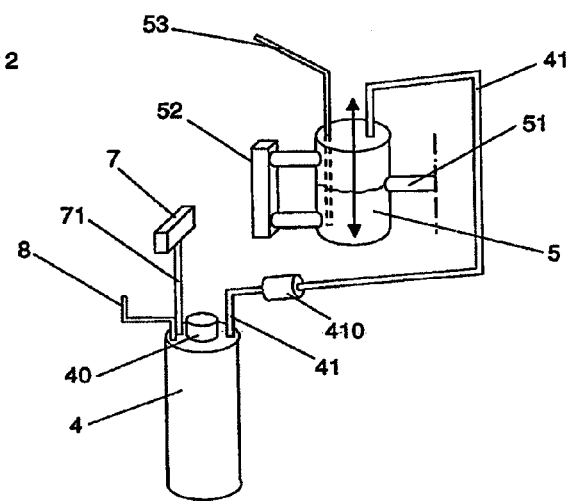
FIG. 2 is a three-dimensional schematic view of a feeding system of a distribution unit for the material used for the formation of the layering of electronically-interactive material.
Figure 3:
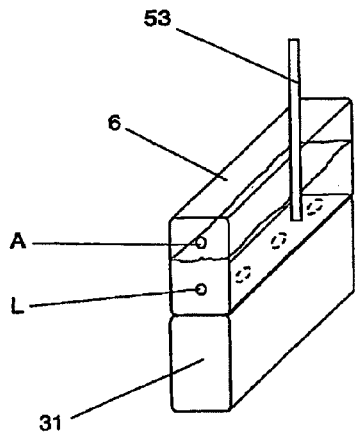
FIG. 3 is a view of the distribution unit for the material used for the formation of the layering of electronically interactive material.

FIG. 2 illustrates a feeding system of the liquefied material (which may be colored, for example, with conductive powder in suspension in the various containers with a respective electroinduced vibration mixer) which comes from a main container 4 with a cover for loading.

This container has two tubes for the liquefied material: one is a feed line 41 for feeding by means of a solenoid check valve 410 to a pressure equalizer and regulator 5 which will be described in detail in the successive operation, and the other is a return line 71 from a recovery and recycling container of the same liquefied material 7, the function of which will be described later.

In this description, the liquefied material means the material used for the formation of the layering of electronically-interactive material used to cover the support or plate of plastic material "S".

From the bottom of the pressure equalizer and regulator 5, there is a pipe 53 which leads to the bottom of a buffer 6 with an upper air chamber "A". The liquid to be -deposited settles in the lower part "L", where there are pipes which take it to a nozzle chamber forming a distribution means for point-type sprays (31) which forms the distributor. The buffer 6 is suitable, therefore, to contain the liquefied electronically-interactive material "L.", while the upper air chamber "A" acts as a pressure compensator, that is as a damper, able to increase or reduce according to the emission and/or consumption of the liquefied Material and, therefore, increase or reduce the request for material from the intermediate pressure equalizer and regulator container (5).

The buffer 6 is positioned above and is joined to the distribution means for point-type sprays (31). Also, the pressure equalizer and regulator 5 may move upwards and downwards parallel to the up and down movement of the distribution means for point-type sprays (31) and the buffer 6 on guide carriages 52. The pressure equalizer and regulator may also be finely regulated in height with respect to the height of the buffer (6) and the distribution means for point-type sprays (31) so that it may regulate the pressure to be either higher or lower according to the difference in level and according to the principle of communicating vessels, with the pressure variation induced by impeding the principle of communicating vessels by means of the presence of the air chamber "A" in the buffer 6. In this way, by being able to regulate the pressure to be either higher or lower according to the programmed value by means of computer control with a microprocessor, the highest functionality is achieved.

It thus becomes possible to comply to the following conditions according to the program:

i. start distribution at the start of the transversal movement according to "X" with a distribution pressure p1;

ii. vary the pressure immediately afterwards to a value p2, where p2<p1, with repetition of the cycle for every transversal movement of distribution-deposit "X"; and iii. vary the distribution again to a value of p3, so that p3>p1, for a cleaning operation of filters where the material passes so as to carry out a maintenance cycle during a non-operational phase, that is, when material is not being deposited according to "i" or "ii".

Figure 4:
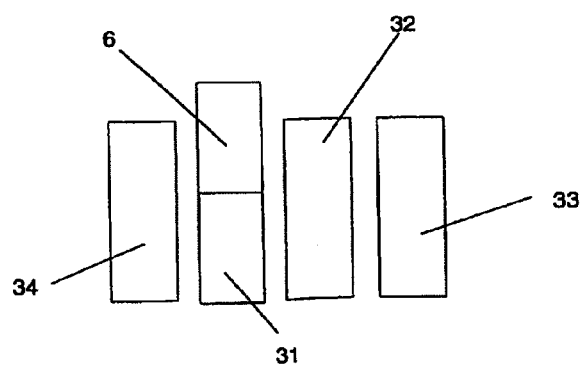
FIG. 4 is a schematic front view of the various components of the distribution unit of the system according to the present invention.

According to FIG. 4 which schematically illustrates the distribution unit 3, we can see that, at the side of the distribution means for point-type sprays (31), on one side there is an ultra-violet light transmitter 34 which has the function of polymerizing the fluid distributed on the surface of the support material (S), with the liquid being distributed in a form to be polymerized due to the action of ultra-violet rays. On the opposite side there is an ultra-sonic distance sensor 32 which detects the distance of the underlying support (S) from the depositing bed and transmits the respective data to the processor so that, according to the program, it brings it closer, takes it further away or holds it at the same distance.

There is also a television camera 33 to the side to view the surface of the support zone subject to the deposit in question, both for fine tuning by means of reference points according to a well known technique and for checking the correct distribution, depositing, regularity of the covering, etc.

Figure 5:
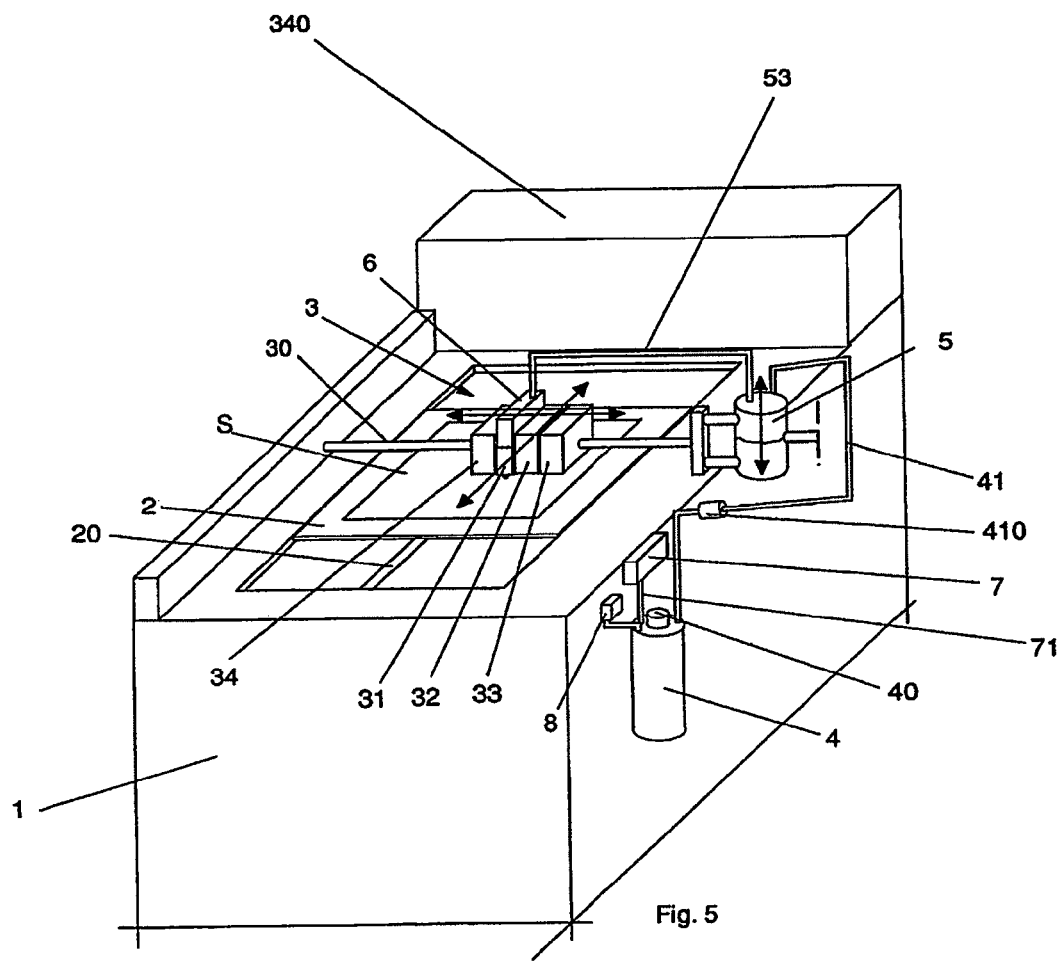
FIG. 5 is a three-dimensional schematic view of a machine which embodies the system for the formation of a layering of electronically-interactive material according to this invention.

According to FIG. 5, we can see a three-dimensional schematic view of a machine which includes all of this-equipment in order to use the system. The machine has a base 1 which includes the electric and computerized electronic system, with a control computer therefor, and which also has the function of supporting the mobile bed 2 which is movable longitudinally by means of worm screws 20, the rotation of which is controlled by the computer. The support panel "S", such as an electronic circuit board (in plastic material, for example), on which the layer of electronically-interactive material is to be formed, is placed on the bed.

A further transversal worm screw 30, the rotation of which is controlled by the computer, is positioned above the mobile bed (2). This transversal screw 30 carries the distribution unit 3 as described.

The system for feeding the liquefied material is connected laterally to the distribution unit (3).

The feeding system is carried out, as already stated, in a controlled way by means of the three containers 4, 5 and 6 with their respective piping.

At the back, block 340 forms the ultra-violet ray generator which feeds the ultra-violet ray transmitter 34.

Going back to the main feed chamber 4 and cover 40, it must be made clear that it also has the return pipe 71 which comes from a lateral tank 7 fixed at the side of the mobile bed 2, in order to be covered during the washing phase of the distribution means for point-type sprays (31) during the non-operational phase of washing the filter with a higher pressure p3.

In this case, the fluid, which is fed for the washing phase, which is neither polluted or damaged, is recovered by the tank from below the nozzles in the distributor means for point-type sprays (31), and taken by means of the pipe 71 to the main container 4.

All three of the containers 4, 5 and 6 have a vibration unit inside to keep the liquid constantly in motion during the feeding operation, in order to keep the suspended substance, which is heavier than the liquid, uniformly distributed (e.g. copper powder for the conductivity of the material, pigments for the insulating material, etc.)

The ultra-violet (UV) ray device 34 advantageously works at room temperature and, because it heats up, it is cooled down at the same time according to a controlled temperature by suitable equipment which is part of the machine. In this way, the polymerization of the deposited material is carried out at room temperature without damaging the material or the support, and without compromising the functionality of the entire depositing unit (3).

The distribution nozzles for the material to be polymerized by means of the distribution unit for point-type sprays (31) are advantageously conformed to supply punctiform (pixel-by-pixel) sprays equal to 1 pixel at a time in logical succession.

There are one or more rows of distribution nozzles. More rows of nozzles or distributors may be foreseen in order to deposit different materials.

An example of different materials could be the following, for example:
conductive material;
insulating material; and
covering or protective material.

A further advantage is that the system includes the activation or shut-down of the ultra-violet ray polymerization device (34) in a controlled way to make the following possible:
the direct polymerization immediately after being, deposited, or
to fix it.

What is claimed is:

1. A system for depositing liquefied material onto a support surface, the system comprising:
    a distribution unit comprising nozzles which eject the liquefied material onto the support surface; and
    a feeding system which feeds the liquefied material to the distribution unit, wherein the feeding system comprises:
        a main container which stores the liquefied material;
        a recovery container which recovers the liquefied material ejected from the nozzles;
        a return line which transports the liquefied material from the recovery container to the main container;
        at least one feed line which transports the liquefied material from the main container to the distribution unit; and
        a regulator disposed on a liquefied material path between the main container and the distribution unit, wherein the regulator comprises a moveable liquefied material container, wherein a movement of the moveable liquefied material container and the liquefied material therein regulates a distribution of pressure between the regulator and the distribution unit, thus altering a pressure in the distribution unit and altering an ejection pressure of at least one of the nozzles.

2. The system according to claim 1, further comprising:
a mobile bed which supports the support surface, wherein the recovery container is laterally spaced from a side of the mobile bed.

3. The system according to claim 1, wherein the return line comprises a tube and the at least one feed line comprises at least one tube.

* * * * *

UNITED STATES PATENT AND TRADEMARK OFFICE
CERTIFICATE OF CORRECTION

| | |
|---|---|
| PATENT NO. | : 8,196,544 B2 |
| APPLICATION NO. | : 12/788805 |
| DATED | : June 12, 2012 |
| INVENTOR(S) | : Cesare Fumo and Jozef Vodopivec |

It is certified that error appears in the above-identified patent and that said Letters Patent is hereby corrected as shown below:

On Title Page, Item (73), add the following section:

--(73) Assignee: NEW SYSTEM SRL--

Signed and Sealed this
Thirtieth Day of October, 2012

David J. Kappos
*Director of the United States Patent and Trademark Office*